US009071208B2

(12) United States Patent
Nagahisa

(10) Patent No.: US 9,071,208 B2
(45) Date of Patent: Jun. 30, 2015

(54) SIGNAL AMPLIFICATION CIRCUIT AND SIGNAL AMPLIFICATION DETERMINATION CIRCUIT INCLUDING THE SIGNAL AMPLIFICATION CIRCUIT

(71) Applicant: Takeshi Nagahisa, Osaka (JP)

(72) Inventor: Takeshi Nagahisa, Osaka (JP)

(73) Assignee: RICOH COMPANY, LTD., Tokyo (JP)

( * ) Notice: Subject to any disclaimer, the term of this patent is extended or adjusted under 35 U.S.C. 154(b) by 1 day.

(21) Appl. No.: 14/017,447

(22) Filed: Sep. 4, 2013

(65) Prior Publication Data

US 2014/0077872 A1     Mar. 20, 2014

(30) Foreign Application Priority Data

Sep. 14, 2012   (JP) ................. 2012-203389

(51) Int. Cl.
    *H03F 1/02*    (2006.01)
    *H03F 3/38*    (2006.01)
    *H03F 3/387*    (2006.01)
    *H03F 3/45*    (2006.01)

(52) U.S. Cl.
CPC ................. *H03F 3/38* (2013.01); *H03F 3/387* (2013.01); *H03F 3/45475* (2013.01)

(58) Field of Classification Search
CPC ......... H03F 3/45071; H03F 1/14; H03F 1/56; H03F 2200/411; H03F 2203/45212; H03F 2203/45366; H03F 2203/45512; H03F 2203/45528; H03F 2203/45544; H03F 2203/45562; H03F 2203/45614; H03F 2203/45616; H03F 1/0205; H03F 1/0211; H03F 1/0222; H03F 1/3241; H03F 3/211; H03F 3/68; H03F 3/45475; H03F 3/45977; H03F 3/189; H03F 3/217; H03F 3/45; H03F 3/45636; H03F 3/45968
USPC .................................. 330/9, 51; 327/124, 307
See application file for complete search history.

(56) References Cited

U.S. PATENT DOCUMENTS 7,295,061 B1 * 11/2007 Dasgupta ..................... 330/9
7,589,587 B2 * 9/2009 Yoshida et al. .............. 330/9
2013/0335131 A1 * 12/2013 Ceballos et al. ............. 330/9

FOREIGN PATENT DOCUMENTS

JP    2008-067050    3/2008

* cited by examiner

*Primary Examiner* — Khanh V Nguyen
(74) *Attorney, Agent, or Firm* — Cooper & Dunham LLP

(57) ABSTRACT

A signal amplification circuit includes an input terminal; a first chopper modulation circuit; a first amplifier having an amplification circuit and a chopper demodulation circuit, a capacitance feedback circuit having a second chopper modulation circuit, a first switch constituting a voltage follower circuit with the amplification circuit; a second switch; a second amplifier to convert the differential output signal from the second output terminal into a single-end signal; and a filter to pass at least a predetermined frequency component of the chopping frequency from the single-end signal from the second amplifier to output an output signal of the signal amplification circuit.

7 Claims, 14 Drawing Sheets

FIG. 4A1
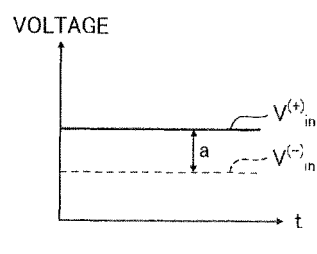
FIG. 4A2
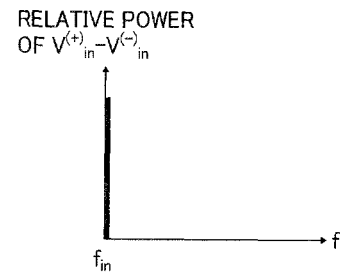
FIG. 4B1
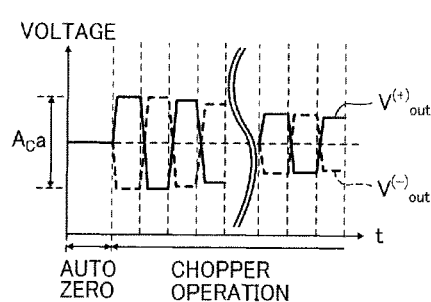
FIG. 4B2
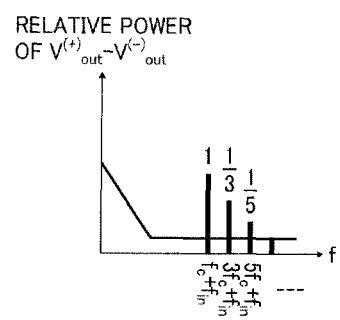
FIG. 4C1
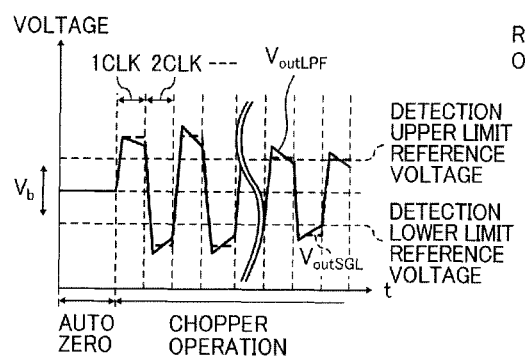
FIG. 4C2
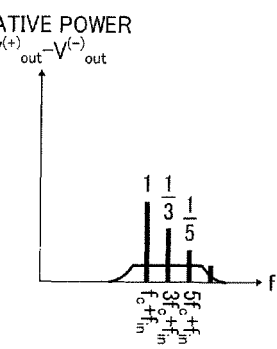

COMPARATIVE EXAMPLE

SW (SWa–SWh)

COMPARATIVE EXAMPLE

COMPARATIVE EXAMPLE

SIGNAL AMPLIFICATION CIRCUIT AND SIGNAL AMPLIFICATION DETERMINATION CIRCUIT INCLUDING THE SIGNAL AMPLIFICATION CIRCUIT

CROSS-REFERENCE TO RELATED APPLICATION

This patent application is based on and claims priority pursuant to 35 U.S.C. §119 to Japanese Patent Application No. 2012-203389, filed on Sep. 14, 2012 in the Japan Patent Office, the entire disclosure of which is hereby incorporated by reference herein.

BACKGROUND

1. Technical Field

The present disclosure relates to a signal amplification circuit using a chopper amplifier and a signal amplification determination circuit including the signal amplification circuit, to determine signal level of an input signal.

2. Related Art

Conventionally, in order to add various convenient functions such as a power-saving function to home electronics, various sensors, such as infrared sensors, image sensors, and temperature sensors, have been developed.

In order to amplify the signal from the sensor, for example, a complementary metal oxide semiconductor (CMOS)-type amplifier is used. Nevertheless, some types of sensors generate so small a signal that the sensor signal is buried in the 1/f noise generated by the CMOS-type amplifier and the quality is decreased. Accordingly, this tiny sensor signal is amplified by an amplification circuit using a chopper amplifier.

At the same time, with increasing demand for lower power consumption, the power supply voltage supplied to devices such as sensors is decreasing. However the CMOS analog switches typically used in the chopper amplifier may unnecessarily block intermediate voltage level signals when the chopper amplifier is operated at low voltage.

To enable operation at low voltage, JP-2008-067050-A discloses a capacitance feedback-type chopper amplification circuit, constituted by a switched operational amplifier and chopper modulation circuit formed in the CMOS circuit.

However, in this example, the capacitance feedback-type chopper amplification circuit cannot amplify low-frequency input signals because, when a low-frequency input signal is input to the chopper amplification circuit, the output signal of the chopper amplification circuit is attenuated by parasitic capacitance parasitic to the input terminal of the switched operational amplifier.

SUMMARY

The present invention is conceived in view of the above-described circumstances, and provides a signal amplification circuit and a signal amplification determination circuit that can amplify a signal without decreasing the minute signal having a low frequency that is attenuated by a parasitic capacitor or the like.

In one embodiment of the present disclosure, there is provided a signal amplification circuit that includes an input terminal, a first chopper modulation circuit, a first amplifier, a capacitance feedback circuit, a first switch, a second switch, a second amplifier, and a filter. The first chopper modulation circuit performs chopper modulation on an input signal from the input terminal at a predetermined chopper frequency depending on a predetermined control signal and generate a first chopper modulation signal. The first amplifier includes an amplification circuit and a chopper demodulation circuit. The amplification circuit having an input terminal, a first output terminal, and a second output terminal, amplifies the chopper modulation signal input from the modulation circuit via the input terminal to output an amplifier signal via the second terminal. The chopper demodulation circuit performs chopper demodulation on the amplified signal output from the second output terminal of the amplification circuit at a chopping frequency to output a demodulated signal via an output terminal of the demodulation circuit. The capacitance feedback circuit to feed back the demodulated signal output from output terminals of the chopper demodulation circuit to the input terminal of the amplification circuit via a feedback point connected between the first modulation circuit and the amplification circuit of the first amplifier. The capacitance feedback circuit includes a second chopper modulation circuit to perform chopper modulation on the demodulated signal from the chopper demodulation circuit at the chopper frequency depending on the control signal to generate a second chopper modulation signal for outputting to the input terminal of the amplification circuit of the first amplifier via the feedback point of the capacitance feedback circuit. The first switch performs automatically zero operation of inputting a signal voltage output from the first output terminal of the amplification circuit of the first amplifier in an auto zero period before an amplification period, the connection of the first switch and the amplification circuit constituting a voltage follower circuit. The second switch connects the input terminal of the signal amplification circuit and the feedback point via the first modulation circuit. The second amplifier converts the amplified signal from the second output terminal of the amplification circuit into a single-end signal. The filter passes at least a predetermined frequency component of the chopping frequency from the single-end signal from the second amplifier to output an output signal of the signal amplification circuit.

In another embodiment of the present disclosure, there is provided a signal amplification determination circuit to include the above-described signal amplification circuit and a determination circuit to determine whether the level of the output signal from the signal amplification circuit is in a certain range to output the determination result.

BRIEF DESCRIPTION OF THE DRAWINGS

A more complete appreciation of the disclosure and any of the attendant advantages thereof will be readily obtained as the same becomes better understood by reference to the following detailed description when considered in connection with the accompanying drawings, wherein:

FIG. 4A1 is a graph illustrating one example of respective input signals $V_{in}^{(+)}$ and $V_{in}^{(-)}$;

FIG. 4A2 is a graph illustrating frequency characteristics in the voltage difference "$V_{in}^{(+)} - V_{in}^{(-)}$" between the input signals $V_{in}^{(+)}$ and $V_{in}^{(-)}$ shown in FIG. 4A1;

FIG. 4B1 is a graph illustrating one example of respective intermediate input signals $V_{out}^{(+)}$ and $V_{out}^{(-)}$ obtained by performing chopper modulation and amplifying by chopper amplifier;

FIG. 4B2 is a graph illustrating frequency characteristics in voltage difference "$V_{out}^{(+)}-V_{out}^{(-)}$" between the intermediate input signals $V_{out}^{(+)}$ and $V_{out}^{(-)}$ shown in FIG. B1;

FIG. 4C1 is a graph illustrating an output signal $V_{outSGL}$ after the intermediate signals $V_{out}^{(+)}$ and $V_{out}^{(-)}$ are amplified by a differential signal amplifier and an output signal $V_{outLPF}$ respectively;

FIG. 4C2 is a graph illustrating frequency characteristics in the output signal $V_{outLPF}$ shown in FIG. 4C1;

DETAILED DESCRIPTION

Figure 1:
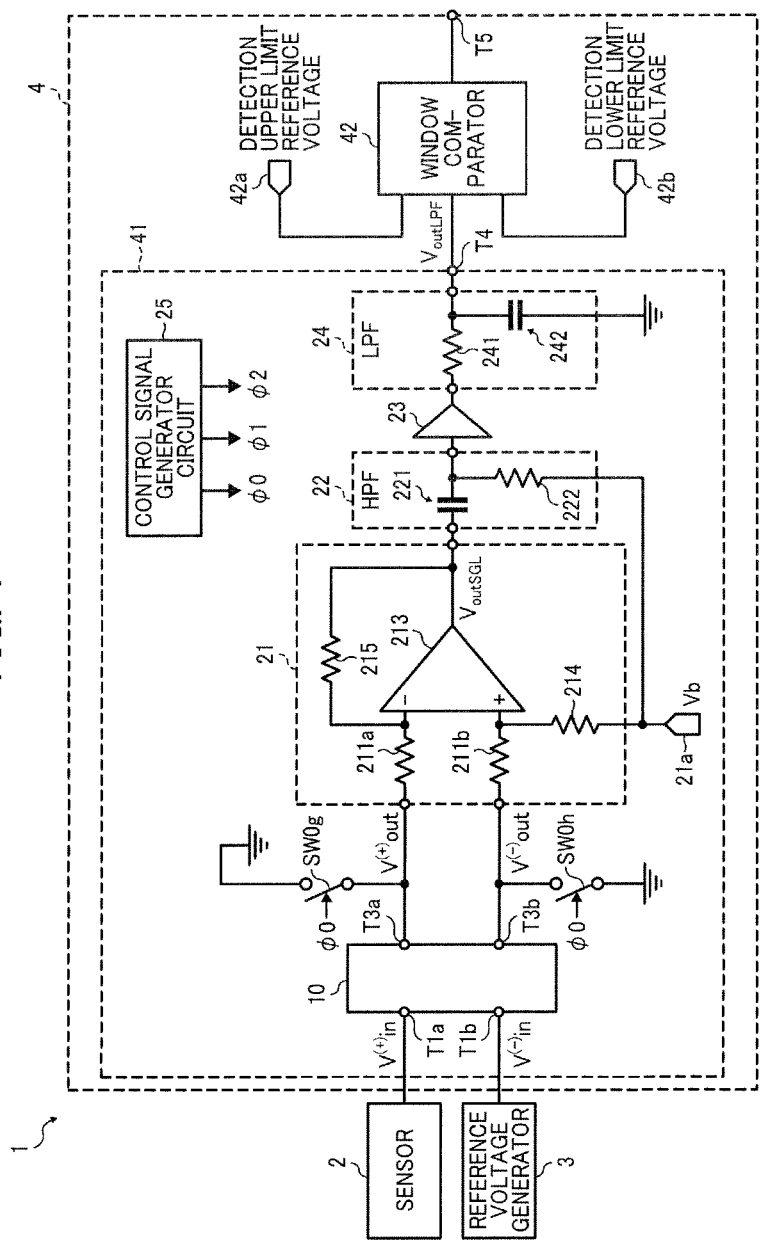
FIG. 1 is a circuit diagram illustrating a configuration of a signal amplification determination circuit according to a first embodiment of the present disclosure.

In describing preferred embodiments illustrated in the drawings, specific terminology is employed for the sake of clarity. However, the disclosure of this patent specification is not intended to be limited to the specific terminology so selected, and it is to be understood that each specific element includes all technical equivalents that have a similar function, operate in a similar manner, and achieve a similar result.

In order to facilitate an understanding of the non-predictable effects of the present invention, a description is first given of several comparative examples, with reference to FIGS. 10-15B.

Figure 10:
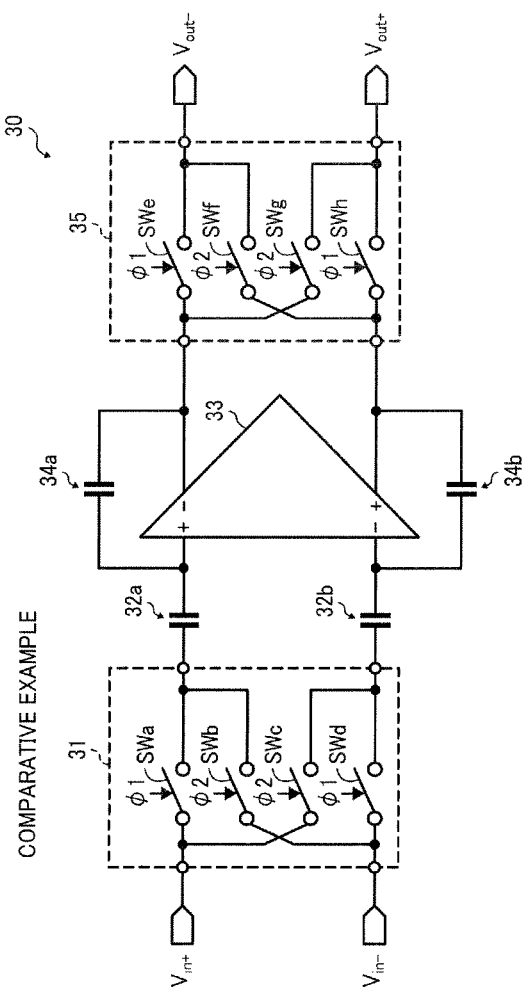
FIG. 10 is a circuit diagram illustrating a general chopper amplification circuit according to a comparative example.
Figure 11A:
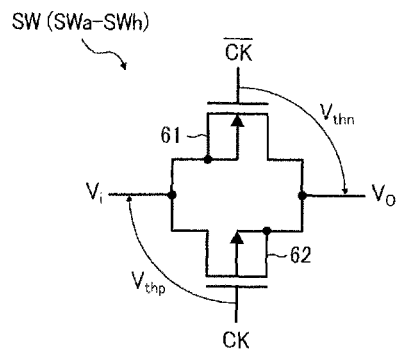
FIG. 11A is a circuit diagram illustrating a configuration of respective switches SWa to SWh shown in FIG. 10.
Figure 11B:
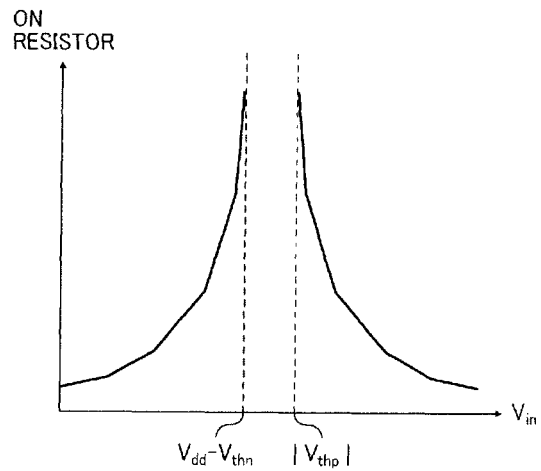
FIG. 11B is a graph illustrating characteristics of the on resistance between drains and sources of Nch transistor 61 and Pch transistor 62 corresponding to an input signal of the switch SW shown in FIG. 11A.

FIG. 10 is a circuit diagram illustrating a chopper amplification circuit 30 according to a general comparative example. FIG. 11A is a circuit diagram illustrating a configuration of respective switches SWa to SWh (collectively called as a switch SW) In FIG. 11A, the switch SW is a complementary metal-oxide semiconductor (CMOS) analog switch including a negative channel (Nch) transistor 61 having a threshold value $V_{thn}$ and positive channel (Pch) transistor 62 having a threshold value $V_{thp}$. FIG. 11B is a graph illustrating characteristics of the on resistance between the drains and sources of the Nch transistor 61 and the Pch transistor 62 corresponding to an input signal $V_{in}$ of the switch SW shown in FIG. 11A. In FIG. 10, the switches SWa to SWd constitute a modulation circuit 31 to perform chopper modulation. The switches SWe to SWh constitute a demodulation circuit 35 to perform chopper demodulation.

In FIG. 11A, when a power voltage $V_{dd}$ is low so that relation "$V_{dd}-V_{thn}<|V_{thp}|$" is obtained, the switch SW has an on resistance characteristics illustrated in FIG. 11B. In this case, when the input signal Vi having an intermediate voltage level that satisfies the relation "$V_{dd}-V_{thn}<|V_{thp}|$" is input to the switches SW, because the on-resistance between the drain and source of the respective transistors 61 and 62 are great and the switches SW are blocked. Accordingly, the chopper amplification circuit 30 cannot amplify a minute low-frequency input signal.

In order to solve this problem, another comparative example of the chopper amplification circuit is proposed. The inventor conducted a study on the characteristics of a chopper amplification circuit 100 according to another comparative example. When a low-frequency input signal is input to the chopper amplification circuit 100, the chopper amplification circuit 100 cannot amplify without deteriorating the low-frequency input signal caused by the parasitic capacitor parasitic to an input terminal of a switched operational amplifier. The problem is described below.

Figure 12:
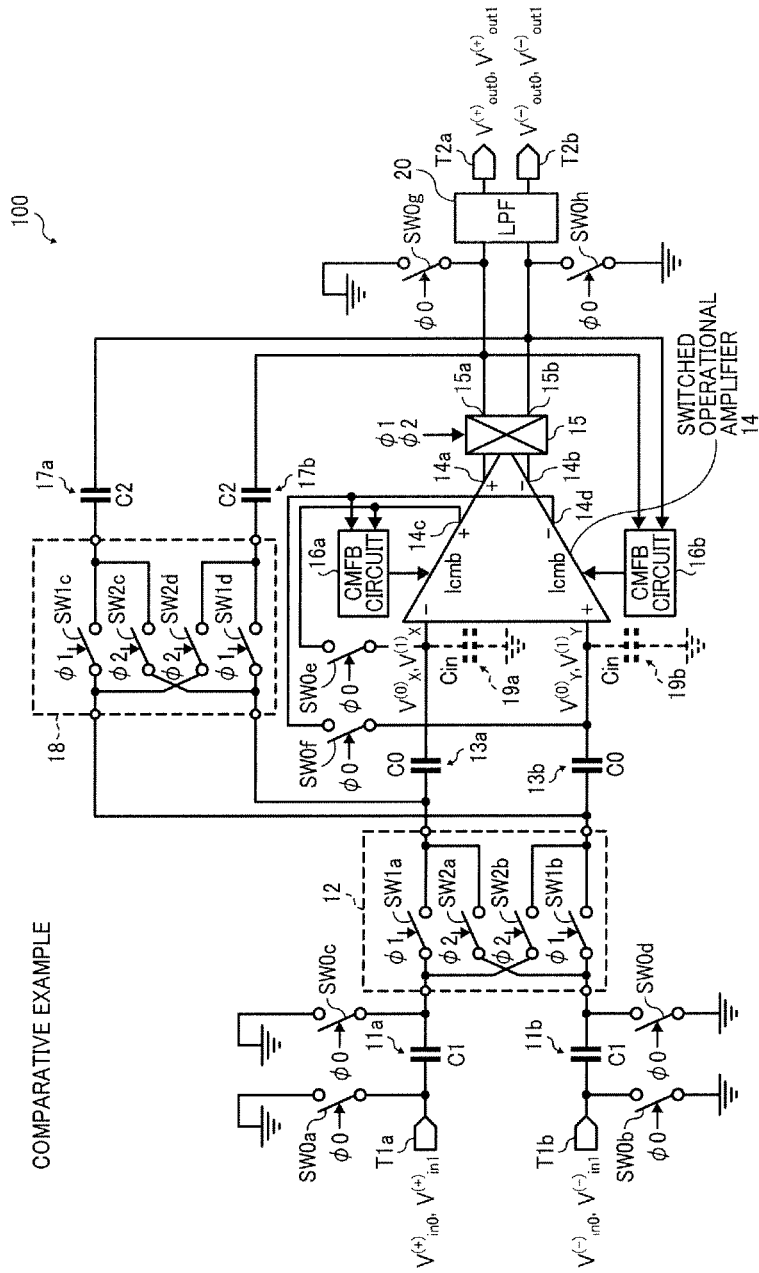
FIG. 12 is a circuit diagram illustrating a configuration of a chopper amplification circuit according to another comparative example.

FIG. 12 is a circuit diagram illustrating a configuration of the chopper amplification circuit 100 according to a comparative example. In the chopper amplification circuit 100, after input signals input to two input terminals T1a and T1b are chopper modulated and amplified and then the amplified signal is chopper demodulated, the demodulated output signal is output via output terminals T2a and T2b. Modulation circuits 12 and 18 to perform chopper modulation are arranged at a vertical contact points. In the chopper amplification circuit 100, by switching switches SW0a to SW0d on to reset the circuit in an Auto zero period, voltages at two input terminals of the modulation circuit 12 can be set close to ground in a chopper operation period for normal operation. In addition, the switched operational amplifier 14 provided in the chopper amplification circuit 100 outputs a voltage almost ranging from power supply voltage to a ground voltage. Herein, switches SW0a to SW0f, SW1a to SW1d, and SW2a to SW2d constitute the configuration of the switch SW shown in FIG. 11A. Parasitic capacitors 19a and 19b having capacitance Cin are parasitic to an inversed input terminal (−) and a non-inversed input terminal (+) of the switched operational amplifier 14, respectively.

In the chopper operation period, the switches SW0a through SW0d are turned off to execute Auto zero correction. The modulation circuit 12 includes the switches SW1a, SW1b, SW2a, and SW2b and executes chopper modulation on the signal input to the modulation circuit 12 at a chopper frequency $f_c$ in the chopper operational period. In one chopping cycle $1/f_c$, the chopper operation executed by the modulation circuit 12 is formed by two operations including an operation I0 and an operation I1, and the modulation circuit 12 alternatively executes the two operations I0 and I1 depending on the complementally control signal φ1 and φ2. In the operation I0, the switches SW1a and SW1b are turned on using the control signal φ1, and the switches SW2a and SW2b are turned off using the control signal φ2. In the operation I1, the switches SW1a and SW1b are turned off using the control signal φ1, and the switches SW2a and SW2b are turned on using the control signal φ2. The modulation circuit 18 has a same configuration to the modulation circuit 12. Herein, the switches SW1c, SW1d, SW2c, and SW2d in the modulation circuit 18 correspond to the switches SW1a, SW1b, SW2a, and SW2b in the modulation circuit 12. The modulation circuit 18 performs chopper modulation on the signal input to the modulation circuit 18, using the chopping frequency $f_c$, in the chopper operation period. The demodulation circuit 15 is used to demodulate a signal input to the demodulation circuit 15 at the chopping frequency $f_c$, and the demodulation circuit 15 is constituted by, for example, the configuration similar to the modulation circuits 12 and 18.

The total amount of the charge contained in capacitors 11a and 11b having capacitance C1 and capacitors 17a and 17b having a capacitance C2, and the charge stored in the parasitic capacitors 19a and 19b are kept before and after the transition of the chopper operation from the operation I0 to the operation I2, the following two formulas holds;

(Formula 1)

$$-C_2(V_{out1}^{(-)}-V_X^{(1)})+C_{in}V_X^{(1)}+C_1(V_X^{(1)}-V_{in1}^{(-)})=-C_2(V_{out0}^{(-)}-V_Y^{(0)})+C_{in}V_X^{(0)}+C_1(V_Y^{(0)}-V_{in0}^{(-)}) \quad (1)$$

(Formula 2)

$$-C_2(V_{out1}^{(+)}-V_Y^{(1)})+C_{in}V_Y^{(1)}+C_1(V_Y^{(1)}-V_{in1}^{(+)})=-C_2(V_{out0}^{(+)}-V_X^{(0)})+C_{in}V_Y^{(0)}+C_1(V_X^{(0)}-V_{in0}^{(+)}) \quad (2)$$

In the formulas 1 and 2, at a time t1 when start of the operation I0, input signals of the input terminals T1a and T1b are represented as $V_{in0}^{(+)}$ and $V_{in0}^{(-)}$, the chopper modulation signals input to the inverted input terminal (−) and the non-inverted input terminal (+) of the switched operational amplifier 14 are represented as $V_x^{(0)}$ and $V_y^{(0)}$, the output signals at the output terminals T2a and T2b are represented as $V_{out0}^{(+)}$ and $V_{out0}^{(-)}$. At a time when a time 1 CLK has elapsed from the time t1, the input signals at the input terminals T1a and T1b are represented as a $V_{in1}^{(+)}$ and $V_{in1}^{(-)}$, the chopper modulation signals input to the inverted input terminal (−) and the non-inverted input terminal (+) of the switched operational amplifier 14 are represented as $V_X^{(1)}$ and $V_Y^{(1)}$, and the output signals at the output terminals T2a and T2b are represented as $V_{out1}^{(+)}$ and $V_{out1}^{(-)}$.

When the switched operational amplifier 14 has an open-loop gain A, following formula holds;

(Formula 3)

$$A(V_Y^{(0)}-V_X^{(0)})=V_{out0}^{(+)}-V_{out0}^{(-)} \quad (3)$$

(Formula 4)

$$A(V_Y^{(1)}-V_X^{(1)})=-(V_{out1}^{(+)}-V_{out1}^{(-)}) \quad (4)$$

The voltage V at the time t1 and a voltage fluctuation Δ is defined by the following two formulas.

(Formula 5)

$$V_{in0}^{(+)}-V_{in0}^{(-)}=V(t_1) \quad (5)$$

(Formula 6)

$$V_{in1}^{(+)}-V_{in1}^{(-)}=V(t_1)+\Delta \quad (6)$$

The voltage fluctuation Δ indicates the fluctuation amount in a voltage difference between the input terminals T1a and T1b in a period of 1CLK of the chopper modulation. Since the value obtained by subtracting the right side of formula 2 from the right side of formula 1 is equal to the value obtained by subtracting the left side of the formula 2 from the left side of the formula 2, following formula holds;

(Formula 7)

$$-C_2(V_{out1}^{(-)}-V_{out1}^{(+)})+(C_2+C_1+C_{in})(V_X^{(1)}-V_Y^{(1)})-C_1(V_{in1}^{(-)}-V_{in1}^{(+)})=-C_2(V_{out0}^{(-)}-V_{out0}^{(+)})+(C_1+C_2-C_{in})(V_Y^{(0)}-V_X^{(0)})-C_1(V_{in0}^{(-)}-V_{in0}^{(+)}) \quad (7)$$

By deforming the formula 7 using the formulas 3 through 6, the following formula holds;

(Formula 8)

$$V_{out1}^{(+)}-V_{out1}^{(-)} = \frac{C_2+\frac{C_1+C_2-C_{in}}{A}}{C_2+\frac{C_1+C_2+C_{in}}{A}}(V_{out0}^{(+)}-V_{out0}^{(-)}) + \frac{C_1}{C_2+\frac{C_2+C_1+C_{in}}{A}}\Delta \quad (8)$$

Herein, when parasitic capacitance Cin is not zero, the following formula holds;

(Formula 9)

$$\left|\frac{C_2+\frac{C_1+C_2-C_{in}}{A}}{C_2+\frac{C_1+C_2+C_{in}}{A}}\right| < 1 \quad (9)$$

Accordingly, when the input signal is low frequency so that the following formula holds, more specifically, when the voltage fluctuation Δ is small so that the following formula holds, the voltage "$|V_{out1}^{(+)}-V_{out1}^{(-)}|$" when the operation I1 is started is set shorter than the voltage difference "$|V_{out0}^{(+)}-V_{out0}^{(-)}|$" at the time 1CLK before the operation I1 is started.

(Formula 10)

$$\left|\left(1-\frac{C_2+\frac{C_1+C_2-C_{in}}{A}}{C_2+\frac{C_1+C_2+C_{in}}{A}}\right)(V_{out0}^{(+)}-V_{out0}^{(-)})\right| > \left|\frac{C_1}{C_2+\frac{C_2+C_1+C_{in}}{A}}\Delta\right| \quad (10)$$

Figure 13:
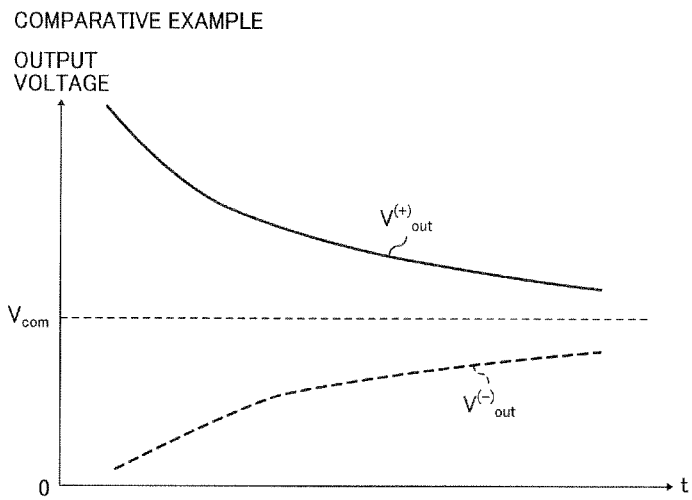
FIG. 13 is a graph illustrating transient characteristics of the output signals $V_{out}^{(+)}$ and $V_{out}^{(-)}$ when voltage difference "$V_{in}^{(+)}-V_{in}^{(-)}$" is kept constant in the chopper amplification circuit shown in FIG. 12.

FIG. 13 is a graph illustrating transient characteristics of the output signals $V_{out1}^{(+)}$ and $V_{out1}^{(-)}$ when the voltage difference "$V_{in1}^{(+)}-V_{in1}^{(-)}$" kept constant in the chopper amplification circuit 100 shown in FIG. 12. As illustrated in FIG. 13, in the chopper operation period, the voltage difference "$V_{out1}^{(+)}-V_{out1}^{(-)}$" of the output signals $V_{out1}^{(+)}$ and $V_{out1}^{(-)}$ is gradually decreased whenever the chopper operation is switched between the operation I0 and the operation I1. Herein, it is desired operation that the voltage difference "$V_{out1}^{(+)}-V_{out1}^{(-)}$" of the output signals "$V_{out1}^{(+)}$ and $V_{out1}^{(-)}$ is kept at a constant value when the voltage difference "$V_{in}^{(+)}-V_{in}^{(-)}$" of the input signals $V_{in}^{(+)}$ and $V_{in}^{(-)}$" is constant.

Figure 14:
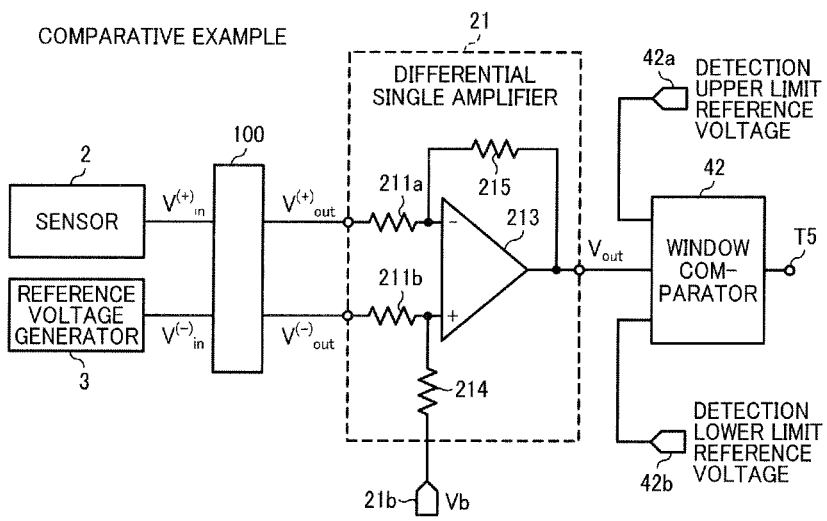
FIG. 14 is a circuit diagram illustrating a configuration of a signal amplification determination circuit using the chopper amplification circuit shown in FIG. 10.
Figure 15A:
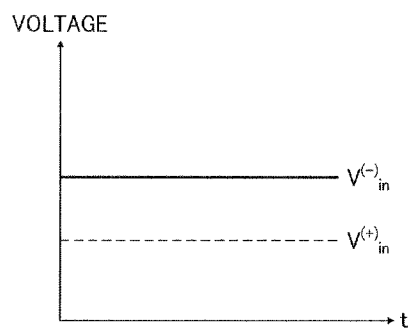
FIG. 15A is a graph illustrating one example of input signals $V_{in}^{(+)}$ and $V_{in}^{(-)}$ having low frequencies input to the chopper amplification circuit shown in FIG. 14.
Figure 15B:
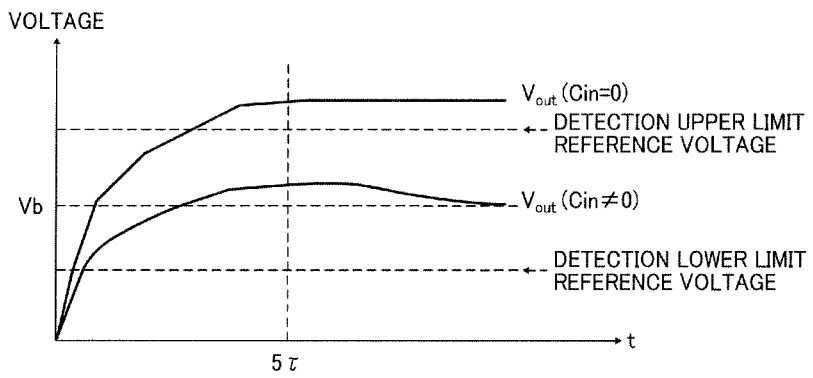
FIG. 15B is a graph illustrating an output voltage $V_{out}$ input to a window comparator based on the input signals shown in FIG. 15A.

FIG. 14 is a circuit diagram illustrating a configuration of a signal amplification determination circuit using the chopper amplification circuit 100 shown in FIG. 10. FIG. 15A is a graph illustrating one example of the low-frequency input signals $V_{in}^{(+)}$ and $V_{in}^{(-)}$ input to the chopper amplification circuit 100 shown in FIG. 14. FIG. 15B is a graph illustrating the output voltage $V_{out}$ input to a window comparator 42 based on the input signals $V_{in}^{(+)}$ and $V_{in}^{(-)}$ shown in FIG. 15A.

In the signal amplification determination circuit shown in FIG. 14, the chopper amplification circuit 100 amplifies the input signals $V_{in}^{(+)}$ and $V_{in}^{(-)}$, the differential single amplifier 21 converts the amplified output signals into a single-end signal based on the reference voltage Vb as an output signal $V_{out}$ for output to the window comparator 42. In the example shown in FIG. 15A, both the input signal $V_{in}^{(+)}$ from the sensor 2 and the input signal $V_{in}^{(-)}$ from the reference voltage generator 3 are low-frequency signals. In this example, if the parasitic capacitors 19a and 19b are not present, that is, the parasitic capacitances of the parasitic capacitors 19a and 19b are zero, after a time constant "t" of the low-pass filter 20 has elapsed from the time at which the chopper operation is started, the output signal $V_{out}$ is converged on a value "(C2/C1)×($V_{in}^{(+)}-V_{in}^{(-)}$)+Vb".

However in actual, the parasitic capacitance Cin is not zero; therefore, the voltage difference of the output voltage "$V_{out}^{(+)}-V_{out}^{(-)}$" is degraded, and the value of the difference voltage "$V_{out}^{(+)}-V_{out}^{(-)}$" may be converged on almost zero, and the output signal $V_{out}$ may be converged on the reference voltage Vb.

As described above, in the configuration of the chopper amplification circuit 100 according to the general comparative example, it is necessary to wait whether or not the output signal $V_{out}$ exceeds a detection upper limit reference voltage and falls below a detection lower limit reference voltage until settling of the output signal $V_{out}$ is finished. By contrast, when the settling is finished, the voltage difference $V_{out}$ is converged on the reference voltage Vb. Accordingly, the window comparator 42 cannot determine that the output signal $V_{out}$ exceeds the above-described range. That is, the chopper amplification circuit 100 according to the comparative examples cannot amplify the low-frequency input signal.

The inventor disclosure the problem in the above-described chopper amplification circuit 100. In addition, the inventor invented a signal amplification determination circuit to solve this problem and amplify the signal without deteriorating the signal even when a minute, low-frequency input signal is input.

Referring now to the drawings, wherein like reference numerals designate identical or corresponding parts throughout the several views, particularly to FIGS. 1 through 9, a chopper amplification circuit according to illustrative embodiments is described.

First Embodiment

FIG. 1 is a circuit diagram illustrating a configuration of the signal amplification determination system 1 according to a first embodiment of the present disclosure. In FIG. 1, the signal amplification determination system 1 is a system that outputs an output signal indicating a determination result of signal level of the voltage signal output from the sensor 2 via an output terminal T5. The signal amplification determination system 1 includes the sensor 2, a reference voltage generator circuit 3, and a signal amplification determination circuit 4.

The sensor 2 is constituted by such sensors as an infrared sensor, an image sensor, a temperature sensor, an accelerator sensor, a pressure sensor, sound sensor, or a gas sensor, and outputs the voltage signal corresponding to the output result of the sensor 2 for outputting the voltage signal as an input signal $V_{in}^{(+)}$ to a positive side input terminal T1a. The reference voltage generator 3 generates a reference voltage used for comparing to the input signal $V_{in}^{(+)}$ from the sensor 2, for outputting the reference voltage as an input signal $V_{in}^{(-)}$ to a negative side input terminal T1b.

In FIG. 1, the signal amplification determination circuit 4 includes a signal amplification circuit 41 having an Auto Zero operation circuit and a window comparator 42. The signal amplification circuit 41 performs chopper modulation on the input signals $V_{in}^{(+)}$ and $V_{in}^{(-)}$, amplifies a voltage difference "$V_{in}^{(+)}-V_{in}^{(-)}$" to output the amplified voltage difference as an output signal $V_{outLPF}$ via an output terminal T4. The window comparator 42 corresponds to a case in which the output signal $V_{outLPF}$ exceeds a range between a predetermined detection upper limit reference voltage and a predetermined detection lower limit reference voltage and a case in which the output signal $V_{outLPF}$ does not exceed or fall below the range, and generates a high-level signal and low-level signal corresponding to the respective cases via the output terminal T5. The output signal from the window comparator 42 indicates the determination result of the signal amplification determination circuit 4. The detection upper limit reference voltage and the detection lower limit reference voltage are input to terminals 41a and 41b of the window comparator 42.

The signal amplification circuit 41 shown in FIG. 1 includes a chopper amplifier 10, a differential single amplifier 21, a high-pass filter 22 constituted by a capacitor 221 and a resistor 222, a buffer 23 in which an input impedance is set greater than an output impedance, a low-pass filter 24 constituted by a resistor 241 and a capacitor 242, a control signal generator circuit 25, and switches SW0g and SW0h.

The chopper amplifier 10 performs chopper modulation and amplify the input signals $V_{in}^{(+)}$ and $V_{in}^{(-)}$, and outputs amplified signals as intermediate output signals $V_{out}^{(+)}$ and $V_{out}^{(-)}$ to output via the intermediate output terminals T3a and T3b. The differential single amplifier 21 includes an operational amplifier 213 and resistors 211a, 211b, 214, and 215. The positive side intermediate output $V_{out}^{(+)}$ is input to an inverted input terminal (−) of the operational amplifier 213 via the resistor 211a, and the negative side intermediate output $V_{out}^{(-)}$ is input to a non-inverted input terminal (+) of the operational amplifier 213 via the resistor 211b. The resistor 215 used for feedback is connected between the output terminal and the inversed input terminal (−) of the operational amplifier 213, the resistor 214 is connected between the terminal 21a to which the reference voltage Vb is input and the non-inverted input terminal (+) of the operational amplifier 213. Herein, in the present embodiment, although the differential single amplifier 21 has an amplification rate of 1, alternatively, the amplification rate of the operational amplifier 213 may be set greater than 1.

The differential single amplifier 21 converts the intermediate output signals $V_{out}^{(+)}$ and $V_{out}^{(-)}$ as the differential signals to a single-end signal based on the reference voltage Vb, and outputs a converted output signal $V_{outSGL}$ ($V_{outSGL}=V_{out}^{(+)}-V_{out}^{(-)}+Vb$). Between the output terminal of the differential single amplifier 21 and the output terminal T4 of the signal amplification circuit 41, the high-pass filter 22, the buffer 23, and the low-pass filter 24 are connected in series from the output terminal of the differential single amplifier 21 side to the output terminal T4 side. The capacitor 221 of the high-pass filter 22 is connected between an input terminal and an output terminal of the high-pass filter 22, and the resistor 222 is connected between an output terminal of the high-pass filter 22 and the terminal 21a. The resistor 241 of the low-pass filter 24 is connected between an input terminal and an output terminal of the low-pass filter 24, and the output terminal of the low-pass filter 24 is connected to the ground via the capacitor 242. The output signal $V_{outSGL}$ from the differential single amplifier 21 passes through the high-pass filter 22, the buffer (impedance conversion element) 23, the low-pass filter 24, then is output to the window comparator 42 via the output terminal T4 as the output signal $V_{outLPF}$ of the signal amplification circuit 41.

Figure 2:
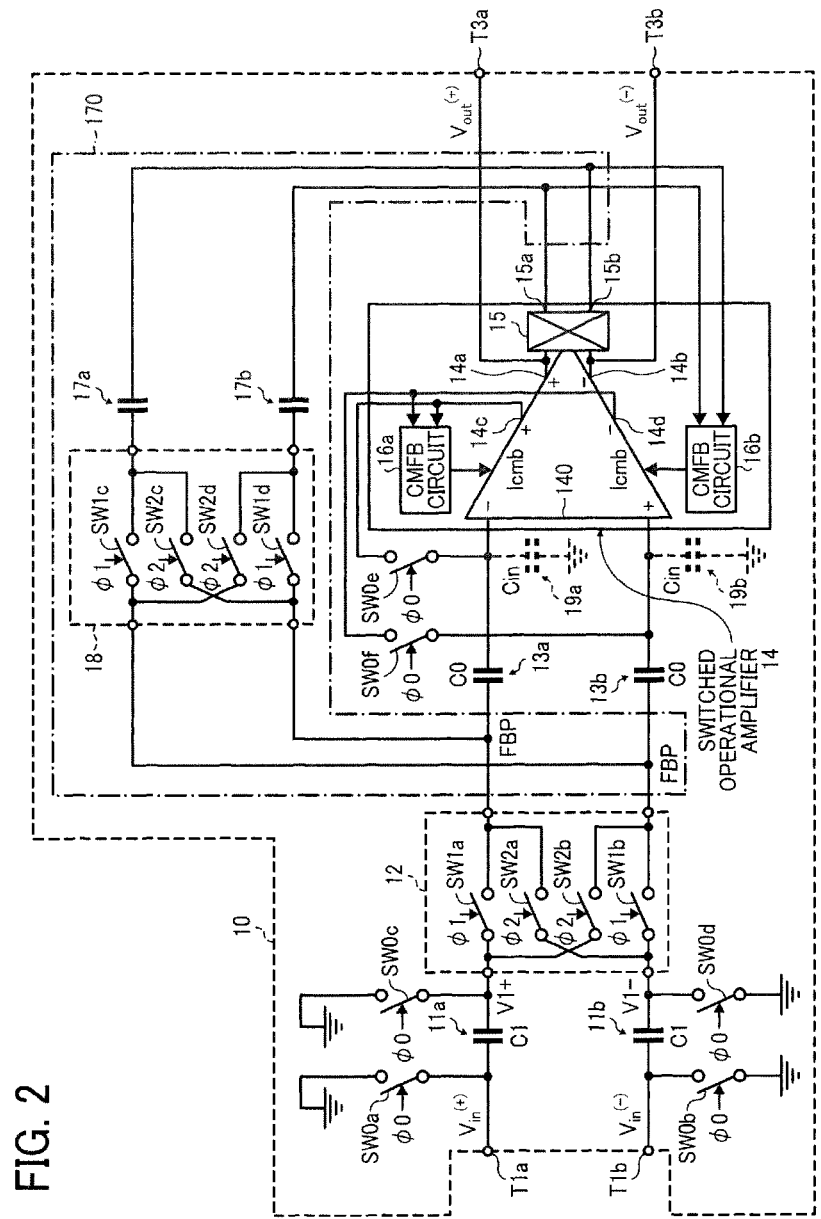
FIG. 2 is a circuit diagram illustrating a configuration of a chopper amplifier shown in FIG. 1.
Figure 3:
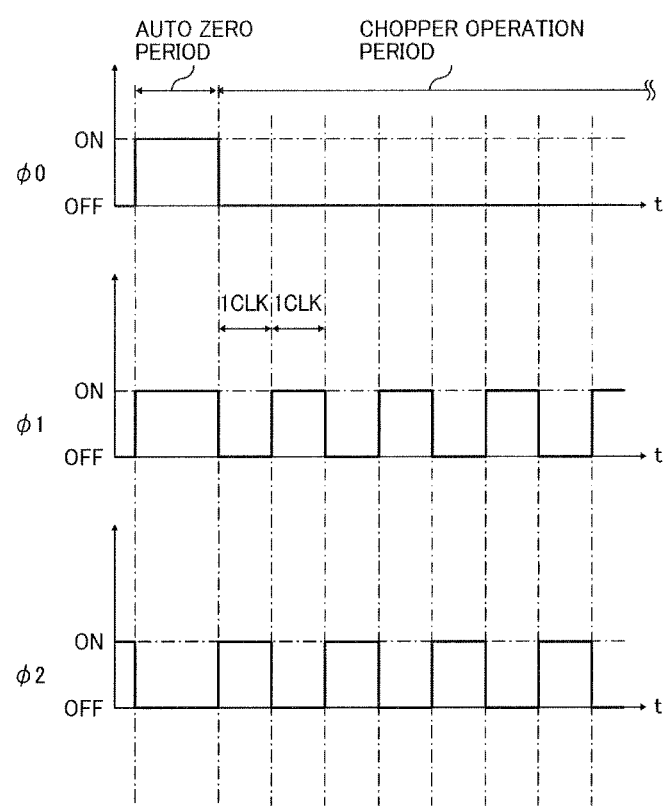
FIG. 3 is a timing chart illustrating control signals $\phi 0$, $\phi 1$, and $\phi 2$ generated by a signal control generator circuit shown in FIG. 1.

FIG. 2 is a circuit diagram illustrating a configuration of the chopper amplifier 10. FIG. 3 is a timing chart illustrating the control signals φ0, φ1, and φ2 generated by the signal control generator circuit 25 shown in FIG. 1. The control signal generator 25 generates the control signal φ0 used for Auto zero operation, and the control signals φ1 and φ2 mutually inversed each other used for chopper operation. In FIG. 1, the control signal φ0 is input to the switches SW0g and SW0h, and the chopper amplifier 10, and the control signals φ1 and φ2 are input to the chopper amplifier 10. The switches SW0g and SW0h are turned on in the Auto zero period to connect the intermediate output terminals T3a and T3b (of the chopper amplifier 10) to the ground. The switches Sw0g and SW0h are controlled using the control signal φ0 and are turned off using the control signal φ0, in the chopper operation period.

In FIG. 2, the chopper amplifier 10 includes capacitors 11a and 11b, a modulation circuit 12, capacitors 13a an 13b, a switched operational amplifier 14, capacitors 17a and 17b, a modulation circuit 18, and switches SW0a to SW0f. Each of the capacitors has a capacitance C1. The modulation circuit 12 performs chopper modulation on the input signals $V_{in}^{(+)}$ and $V_{in}^{(-)}$ output via the capacitors 11a and 11b based on the control signals φ1 and φ2, and outputs a chopper modulation signal (first chopper modulation signal) via a positive output terminal and a negative output terminal. Each of the capacitors 13a and 13b has a capacitance C0. The switched operational amplifier 14 includes an amplification circuit 140, a demodulation circuit 15, and common mode feedback (CMFB) circuits 16a and 16b. The amplification circuit 140 amplifies the chopper modulation signal, input from the modulation circuit 12 to an inverted input terminal (−) and a non-inverted input terminal (−) of the amplification circuit 140 via capacitors 13a and 13b, to output the amplified signal via terminals 14a(+) and 14b(−) thereof. The demodulation circuit 15 perform chopper demodulation on the amplified signals output from the terminals 14a(+) and 14b(−) of the amplification circuit 14 at a chopping frequency $f_c$ to output demodulated signals via output terminals 15a and 15b. The CMFB circuits 16a and 16b perform common-mode feed back. The capacitors 17a and 17b have capacitance C2 respectively, provided in a capacitance feedback circuit 170 to feed back the demodulated signals output from output terminals 15a and 15b of the demodulation circuit 15 to the inverted input terminal (−) and the non-inverted input terminal (+) of the amplification circuit 140. The modulation circuit 18 performs chopper modulation on the demodulated signals output from output terminals 15a and 15b of the demodulation circuit via the capacitors 17 and 17b to output the modulated signals (second chopper modulation signal) to the inverted input terminal (−) and the non-inverted input terminal (+) of the amplification circuit 140.

In FIG. 2, a positive side input terminal of the modulation circuit 12 is connected to the input terminal T1a via the capacitor 11b, and a negative side input terminal of the modulation circuit 12 is connected to the input terminal T1b via the capacitor 11b. The modulation circuit 12 includes switches SW1a and SW1b to be controlled on and off based on the control signal φ1 and switches SW2a and SW2b to be controlled on and off based on the control signal φ2. The switches SW1a, SW1b, SW2a, and SW2b correspond to the switch SW of the above-described comparative example shown in FIG. 11A. In the modulation circuit 12, when the switches SW1a and SW1b are on, the two input signals passes to a subsequent stage through the modulation circuit 12 as is, when the switches SW2a and SW2b are off, the modulation circuit 12 mutually switches the two input signals and outputs the mutually switched signals via the two output terminals of the modulation circuit 12.

The inverted input terminal (−) of the switched operational amplifier 14 is connected to the positive side output terminal of the modulation circuit 12 via the capacitor 13a, and the non-inverted input terminal (+) of the switched operational amplifier 14 is connected to the negative side of the output terminal of the modulation circuit 12 via the capacitor 13b. The capacitance feedback circuit 170 is connected so that the demodulated output signals output from the output terminals 15a and 15b are fed back to the inverted input terminal (−) and the non-inverted input terminal (+) of the switched operational amplifier 14 via feedback points FBP.

The amplification circuit 140 of the switched operational amplifier 14 shown in FIG. 2 installs an automatic differential amplifier to amplify the signal, and the amplification circuit 140 amplifies the chopper modulation signal input to the inverted input terminal (−) and the non-inverted input terminal (+) for output the amplified intermediate output signals $V_{out}^{(+)}$ and $V_{out}^{(-)}$ via the output terminals (second input terminals) 14a and 14b. The demodulation circuit 15 performs chopper demodulation on the amplified intermediate output signals $V_{out}^{(+)}$ and $V_{out}^{(-)}$ based on the control signals φ1 and φ2 and outputs the demodulated signals via the output terminals 15a and 15b. The amplification circuit 140 of the switched operational amplifier 14 includes output terminals (first output terminals) 14c and 14d for operating auto zero. The respective terminals 14a and 14b, having a configuration similar to the switch SW shown in FIG. 11A, are connected to the inverted input terminal (−) and the non-inverted input terminal (+) of the amplification circuit 140 via switches SW0f and SW0e operating based on the control signal φ0. In the Auto zero period, the switches SW0e and SW0f input the signal voltages output from the output terminals (first output terminals) 14c and 14d of the amplification circuit 140 and perform auto zero operation, and circuit of connecting the switches SW0e and SW0f and the amplification circuit 140 constitute a voltage follower circuit. The CMFB circuits 16a and 16b are the circuit to common mode feedback, and are connected between the terminals (first output terminals) 14c and 14d and terminals Icmb of the switched operational amplifier 14.

FIG. 2 shows parasitic capacitors 19a and 19b having a parasitic capacitance Cin parasitic to the inverted input terminal (−) and the non-inverted input terminal (+) of the switched operational amplifier 14. The modulation circuit 18 has a configuration similar to the modulation circuit 12, and performs chopper modulation on the demodulated signal from the output terminals 15a and 15b at the chopping frequency in the chopper operation period. The positive side of the input terminal of the modulation circuit 18 is connected to the positive side output terminal 15a of the demodulation circuit 15 via the capacitor 17a, and the negative side of the input terminal of the modulation circuit 18 is connected to the negative side output terminal 15b of the demodulation circuit 15 via the capacitor 17b.

The respective switches SW0a and SW0c are respectively provided between the input terminal T1a and the ground, and the respective switches SW0b and SW0d are respectively provided between the input terminal T1b and the ground. In addition, the respective switches SW0a and SW0c are provided between the positive side input terminal of the modulation circuit 12 and the ground, and the respective switches SW0b and SW0d are respectively provided between the negative side input terminal of the modulation circuit 12 and the ground. The switches SW0a to SW0d have a configuration similar to the switches SW of the comparative example shown in FIG. 11A and are controlled based on the control signal φ0. The modulation circuit 18 and the capacitors 17a and 17b are implemented in the capacitance feedback circuit 170 for the chopper amplifier 10.

As illustrated in FIG. 3, the output level of the control signal φ0 is high level in the Auto zero period and is low level except the Auto Zero period. The control signal φ1 is on in the Auto Zero period and is alternatively switched on and off at the chopping frequency $f_c$ in the chopper operation period. The control signal φ2 is compensate to the control signal φ1; more specifically, the control signal φ2 is off in the Auto zero period and is alternatively switched on and off at the chopping frequency $f_c$ in the chopper operation period so that the control signal φ2 always indicates the different level signal from the control signal φ1. The length of 1CLK that is a period during which the control signals φ1 and φ2 are kept at on state or off state is a time period "½$f_c$". In the signal amplification circuit 41, the Auto Zero operation and the chopper operation are alternatively repeated with a constant period.

Below describes the operation of the signal amplification determination system 1 with reference to FIGS. 4A1 to 4C2.

FIG. 4A1 is a graph illustrating one example of the respective input signals $V_{in}^{(+)}$ and $V_{in}^{(-)}$. FIG. 4A2 is a graph illustrating frequency characteristics in the voltage difference "$V_{in}^{(+)}-V_{in}^{(-)}$" between the input signals $V_{in}^{(+)}$ and $V_{in}^{(-)}$. FIG. 4B1 is a graph illustrating one example of the respective intermediate input signals $V_{out}^{(+)}$ and $V_{out}^{(-)}$ output from the output terminals T3a and T3b generated by performing chopper modulation and amplifying by the chopper amplifier 10. FIG. 4B2 is a graph illustrating frequency characteristics in the voltage difference "$V_{out}^{(+)}-V_{out}^{(-)}$" between the intermediate input signals $V_{out}^{(+)}$ and $V_{out}^{(-)}$. As illustrated in FIG. 4A1, the voltage difference "$V_{in}^{(+)}-V_{in}^{(-)}$" represents an almost constant value "a" and, as illustrated in FIG. 4A2, relative power of the voltage difference "$V_{in}^{(+)}-V_{in}^{(-)}$" has a peak at a peak frequency $f_{in}$ lower than the chopping frequency $f_c$. FIG. 4C1 is a graph illustrating the output signal $V_{outSGL}$ after the intermediate signals $V_{out}^{(+)}$ and $V_{out}^{(-)}$ are amplified by the differential single amplifier 21 and the output signal $V_{outLPF}$, respectively FIG. 4C2 is a graph illustrating frequency characteristics in the output signal $V_{outLPF}$ shown in FIG. 4C1.

In the Auto zero period, as illustrated in FIG. 3, the control signal generator circuit 25 generates the high-level control signal φ1 to turn on the switches SW0a to SW0h. The input ends and the output ends of the capacitors 11a and 11b, and the intermediate output terminals T3a and T3b are connected to the ground. Therefore, as illustrated in FIG. 4B1, the intermediate output signals $V_{out}^{(+)}$ and $V_{out}^{(-)}$ have the same voltage potential each other. As illustrated in FIG. 4C1, in the Auto zero period, the respective output signal (single-end signal $V_{outSGL}$ and the output signal $V_{outLPF}$ are equal to the reference voltage Vb input to the terminal 21a. In this case, the window comparator 42 determines that the output signal $V_{outLPF}$ is within a range between the detection upper limit reference voltage and the detection lower limit reference voltage. In addition, in the Auto zero period, the signals output from the output terminals (first terminals) 14c and 14d are input to the inverted input terminal and the non-inverted input terminal of the amplification circuit 140 to execute auto zero operation, which forms a voltage follower circuit in the chopper amplifier 10.

After the auto zero period is finished, the chopper operation period is started. Using mutually compensated control signals φ1 and φ2, the modulation circuit 12 performs chopper modulation on the input signals $V_{in}^{(+)}$ and $V_{in}^{(-)}$, the demodulation circuit 15 demodulates the intermediate output signals $V_{out}^{(+)}$ and $V_{out}^{(-)}$, and the modulation circuit 18 performs chopper modulation on the demodulated signals output from the output terminals 15a and 15b of the demodulation circuit 15. When the switched operational amplifier 14 has an amplification ratio Ac, immediately after the chopper operation is started, as illustrated in FIG. 4B1, the value of voltage difference "$V_{out}^{(+)}-V_{out}^{(-)}$" between the voltages $V_{out}^{(+)}$ and $V_{out}^{(-)}$ is alternatively switched between "$A_c \times a$" and "$-(A_c \times a)$" at 1 CLK during the chopper modulation. As illustrated in FIG. 4C1, the differential single amplifier 21 outputs the output signal (single-end output signal) $V_{outSGL}$ ($V_{outSGL}=V_{out}^{(+)}-V_{out}^{(-)}+Vb$). Herein, the output signal $V_{outSGL}$ is represented by the following formula 11.

(formula 11)

$$V_{outLPF} \cong \frac{2}{\pi} A_c (V_{in}^{(+)} - V_{in}^{(-)}) \sum_{i=1}^{N} \frac{(-1)^i}{2n-1} \quad (11)$$

$$(\cos[2\pi f_{in} + (2i-1)2\pi f_c]t + \cos[2\pi f_{in} - (2i-1)2\pi f_c]t)$$

Wherein, the reference numeral "N" represents the minimum integer to fulfill "$N \geq 10^n f_c$".

As illustrated in FIG. 4B2, the relative power of the voltage difference "$V_{out}^{(+)}-V_{out}^{(-)}$" great at frequencies $f_c+f_{in}$, $f_c+3f_{in}$, and $f_c+5f_c$ ..., in the chopper modulation, compared to the frequency $f_c$ immediately before the modulation. Herein, the intermediate output signals and $V_{out}^{(+)}$ and $V_{out}^{(-)}$ contain a noise generated by the switched operational amplifier 14, and the high-pass filter 22 and the low-pass filter 24 filter the frequency component corresponding to the chopping frequency $f_c$ from the output signal $V_{outSGL}$ to decrease the noise, which improves to reduce a signal-to-noise ratio in the output signal $V_{outLPF}$ output from the signal amplification circuit 41.

Figure 5A:
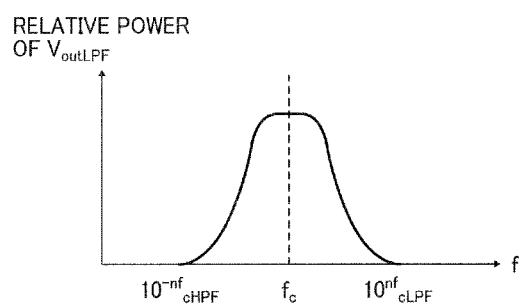
FIG. 5A is a graph illustrating frequency characteristics of the output signal $V_{outLPF}$.
Figure 5B:
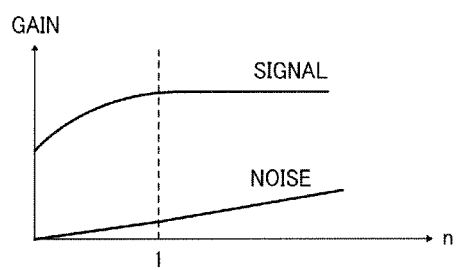
FIG. 5B is a graph illustrating a relation between a signal value and a noise value of an integer n shown in FIG. 5A and the output signal $V_{outLPF}$.

FIG. 5A is a graph illustrating frequency characteristics of the output signal $V_{outLPF}$. The high-pass filter 22 is configured to have a block-frequency $10^{-n}f_{cHPF}$ (n: integer), and the low-pass filter 24 is configured to have a block-frequency $10^n f_{cLPF}$. Herein, the respective frequencies $f_{cHPF}$ and $f_{cLPF}$ are set to, for example, the chopping frequency $f_c$. FIG. 5B is a graph illustrating a relation between the signal value and the noise value of an integer n shown in FIG. 5A and the output signal $V_{outLPF}$. The integer n is selected so that a signal-to-noise ratio in the output signal $V_{outLPF}$ becomes the maximum. The output level of the output signal $V_{outLPF}$ is increased as the integer "n" is increased. By contrast, in general, because the level of heat noise is generally proportional to the integer "n", by increasing the noise value with the increase of the integer rate relative to the signal is decreased when the integer n increases to the integer "n" or more. Based on the simulation result, when the integer n is smaller than 1 (n<1), the signal value of the output signal $V_{outLPF}$ is increased, and when the integer n is greater than 1 (n>1), the increase rate of the signal value of the output signal $V_{outLPF}$ is gradually decreased. Circuit constant values of the high-pass filter 22 and the low-pass filter 24 are determined based on the selected integer n. For example, in the example shown in FIG. 4C2, the lower frequency component lower than "$f_c+f_{in}$" in the output signal $V_{outSGL}$ is attenuated by the high-pass filter 22, and the higher frequency component higher than "$f_c+3f_{in}$" in the output signal $V_{outSGL}$ is attenuated by the low-pass filter 24. Therefore, the signal-to-noise ratio of the output signal $V_{outLPF}$ is improved, compared to the output signal $V_{outSGL}$, and the output signal $V_{outLPF}$ having the improved signal-to-noise ratio is output via the output terminal T4

In the Auto zero period, the capacitance charged in the capacitors 13a and 13b is discharged immediately after the chopper operation is started, which may affect to the intermediate output signals $V_{out}^{(+)}$ and $V_{out}^{(-)}$. However, the changing speed of the output signals $V_{out}^{(+)}$ and $V_{out}^{(-)}$ is delayed compared to the chopping frequency $f_c$, the change of the intermediate output signals $V_{out}^{(+)}$ and $V_{out}^{(-)}$ can be removed by the high-pass filter 22.

Alternatively, if the voltage input to the differential single amplifier 21 is not stick to the power voltage or the ground voltage even when an input offset presenting in the switched operational amplifier 14 is amplified by the switched operational amplifier 14, the configuration for auto zero function implemented in the switched operational amplifier 14 (voltage follower circuit with the switches SW0e and SW0f) may be substituted by the high-pass filter 22, which can be eliminated.

The voltage difference "$V_{out}^{(+)} - V_{out}^{(-)}$" and a voltage difference between the two demodulated signals from the output terminals 15a and 15b of the demodulation circuit 15 are actually attenuated, based on the parasitic capacitance Cin parasitic to the switched operational amplifier 14. However, the attenuation speed of the voltage differences is sufficiently delayed, compared to the chopping frequency $f_c$; in particular, the attenuation can be neglected in the time immediately after the chopper operation is started. Accordingly, if the value "$A_c \times a$" shown in FIG. 4B1 exceeds the range obtained by subtracting the detection lower limit reference voltage from the detection upper limit reference voltage, at the time 1.5 CLK has elapsed from start of the chopper operation, the window comparator 42 detects that the output signal $V_{outLPF}$ does not keep in the range between the detection upper limit reference voltage and the detection lower limit reference voltage, and the window comparator 42 outputs the low-leveled signal via the output terminal T5. That is, at the time 1.5 CLK has elapsed from start of the chopper operation, the signal amplification circuit 41 performs the chopper modulation to amplify the voltage difference "$V_{in}^{(+)} - V_{in}^{(-)}$" of the input signals $V_{in}^{(+)}$ and $V_{in}^{(-)}$ having a low frequency so that the amplitude is set to the value "$A_c \times a$". The signal amplification determination circuit 4, after 1.5 CLK has elapsed from start of the chopper operation, outputs the output signal representing that the sensor 2 detects the detection target via the output terminal T5. As for the timing at which the output signal $V_{outLPF}$ is detected, at the time 0.5 CLK has elapsed from start of the chopper operation may be used. However, the output signal $V_{outLPF}$ is more stable at the time 1.5 CLK has elapsed from start of the chopper operation, and the output signal $V_{outLPF}$ can be more reliably detected.

In the above-configured signal amplification determination system 1 according to the first embodiment, the signal amplification determination circuit 4, at the time 1.5 CLK has elapsed from start of the chopper operation, outputs the output signal indicating that the sensor 2 detects the detection target. That is, the intermediate output signals $V_{out}^{(+)}$ and $V_{out}^{(-)}$ that is amplified from the input signals $V_{in}^{(+)}$ and $V_{in}^{(-)}$ at the desired amplification ratio Ac is applied to the window comparator 42 immediately after the chopper operation is started, and the window comparator 42 performs determination immediately after the chopper operation is started. With this operation, the attenuation rate of the voltage difference between the two input terminals of the switched operational amplifier 41 at the time of determination can be slightly prevented. Therefore, the signal amplification circuit 41 can properly amplify without attenuation of the minute low-frequency signal.

Noted that, if the output signal $V_{outLPF}$ is configured to be stable after 0.5 CLK has elapsed from start of the chopper operation, the window comparator 42, determines that the output signal $V_{outLPF}$ exceeds the predetermined range after 0.5 CLK has elapsed from start of the chopper operation, and outputs the signal having a level corresponding to the determination.

Second Embodiment

Figure 6:
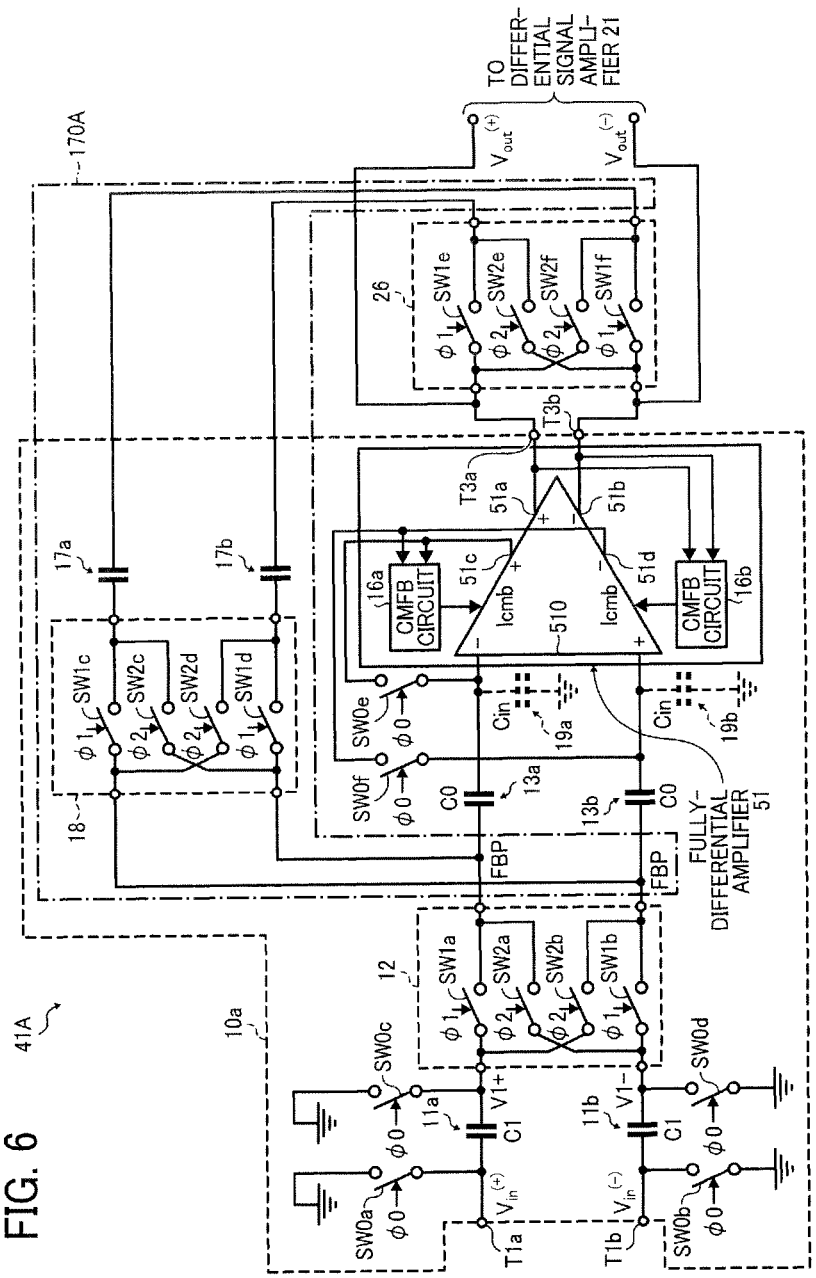
FIG. 6 is a circuit diagram illustrating a configuration of a chopper amplifier and a demodulation circuit, used for the chopper amplifier, to perform chopper demodulation, according to a second embodiment.

FIG. 6 is a circuit diagram illustrating a configuration of a chopper amplifier 10A and a demodulation circuit 26, used for the chopper amplifier 10A, to perform chopper demodulation, according to a second embodiment. What is difference from the signal amplification circuit 41 shown in FIG. 2 is that the signal amplification circuit 41A has following characteristics. The chopper amplifier 10A includes an automatic differential amplifier 51 instead of the switched operational amplifier 14. The demodulation circuit 15 is eliminated from the chopper amplifier 10A. A demodulation circuit 26 that performs the chopper modulation is provided in a subsequent stage of the chopper amplifier 10A.

Similarly to the switched operational amplifier 14, the automatic differential amplifier 51 includes an amplification circuit 510 to amplify the chopper modulation signal from the modulation circuit 12 input to an inversed input terminal and an non-inversed input terminal of the amplification circuit 510 via the capacitors 13a and 13b for outputting via the output terminals 51a and 51b, and the CMFB circuit 16a and 16b to feed back in common mode. The amplification circuit 510 further has output terminals (first output terminals) 51c and 51d used for automatically switch zero. The demodulation circuit 26 is provided outside of the chopper amplifier 10A. The amplified modulation signal output from the output terminals (second output terminal) 51a and 51b of the amplification circuit 510 is input to the demodulation circuit 26 and is chopper demodulated at the chopping frequency $f_c$. In a case in which it is not necessary to make the signal amplification circuit 510 operate at a low voltage, the configuration of the present second embodiment can be used, instead of the configuration of the first embodiment.

As described above, the signal amplification circuit 41A of the second embodiment operates similarly to the signal amplification circuit 41 of the first embodiment, and therefore, the configuration of the second embodiment can achieve effects similar to those of the signal amplification circuit 41 described above.

Third Embodiment

Figure 7:
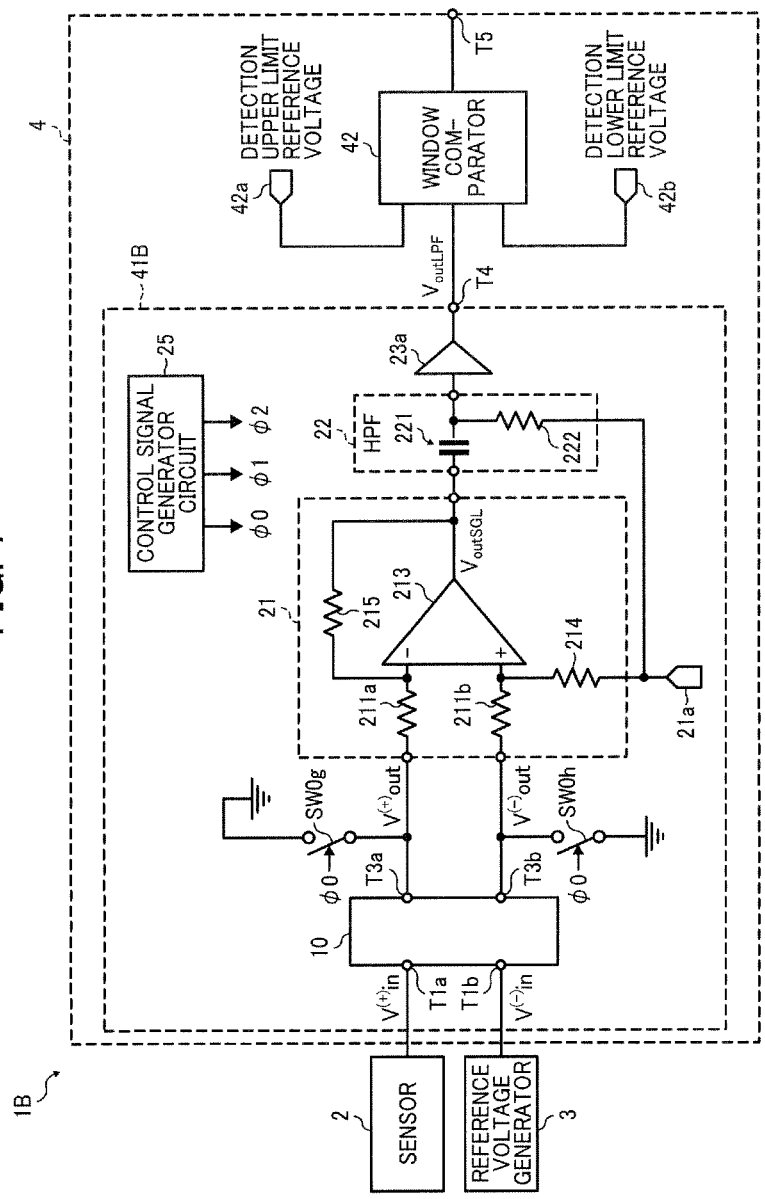
FIG. 7 is a circuit diagram illustrating a configuration of a signal amplification determination circuit according to a third embodiment.

FIG. 7 is a circuit diagram illustrating a configuration of a signal amplification determination circuit 1B according to a third embodiment. What is difference from the signal amplification circuit 41 shown in FIG. 2 is that the signal amplification circuit 41B shown in FIG. 7 has following characteristics. A buffer (impedance conversion circuit) 23a is provided instead of the buffer 23. The buffer 23a contains the function of the low-pass filter 24, and the low-pass filter 24 is not provided.

The buffer 23a shown FIG. 7 installs the low-pass filter configured to have a block frequency $10''f_{cLPF}$. In the buffer 23a, high-frequency range exceeding the block frequency $10''f_{cLPF}$ of the signal output from the high-pass filter 22 is attenuated, and the signal whose high-frequency range is attenuated is output from the buffer 23a. Therefore, noise level of the high-frequency range exceeding the block frequency $10''f_{cLPF}$ of the output signal $V_{outLPF}$ already decreased.

The configuration of the third embodiment can achieve effects similar to those of the signal amplification circuit 41 described above. In addition, the buffer 23s output the output signal $V_{outLPF}$ that has an improved signal-to-noise ratio in a state in which high-frequency range exceeding the block frequency $10''f_{cLPF}$ of the signal output from the high-pass filter 22 is attenuated. Therefore, without providing the low-pass filter in subsequent stage of the buffer 23a, the signal amplification circuit 41B can output the output signal $V_{outLPF}$ having a same rate relative to the signal, as same level as the first embodiment. The configuration of the present embodiment may be implemented by the configuration of the first embodiment or that of the second embodiment.

Fourth Embodiment

Figure 8:
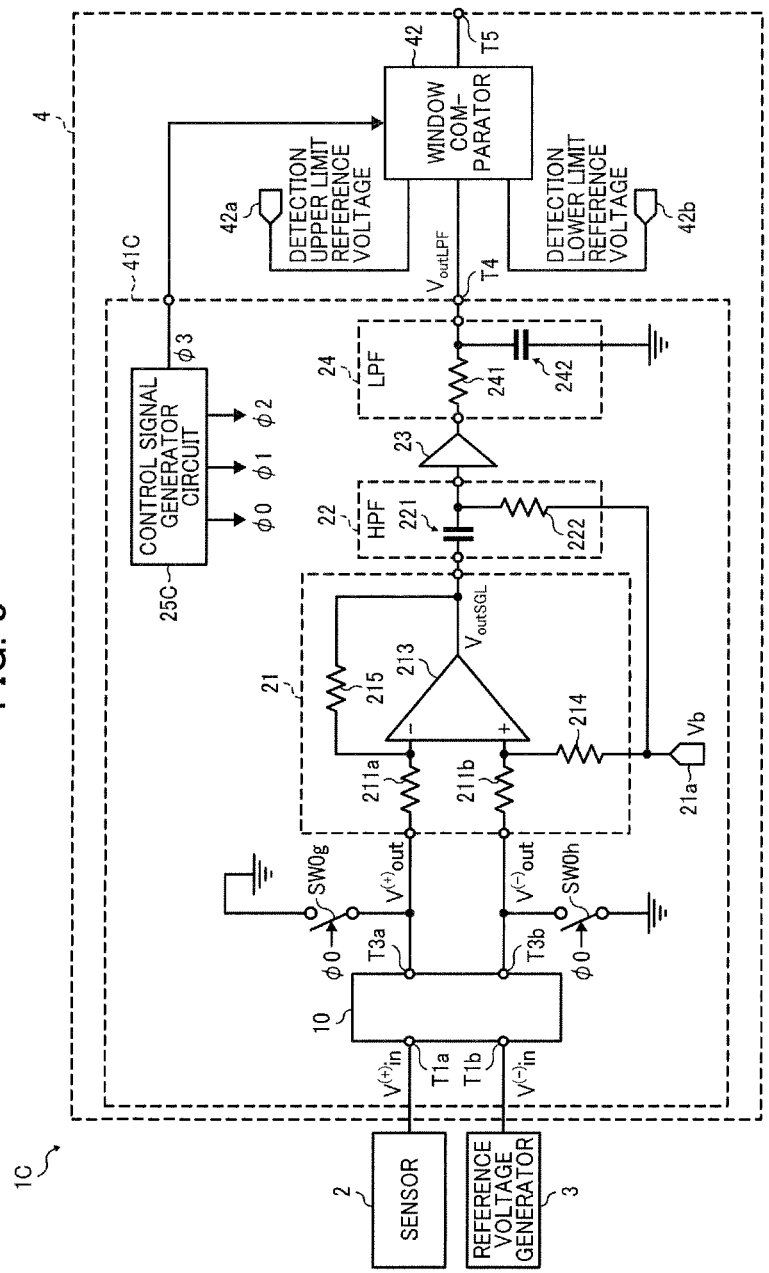
FIG. 8 is a circuit diagram illustrating a configuration of a signal amplification determination circuit according to a fourth embodiment.

FIG. 8 is a circuit diagram illustrating a configuration of a signal amplification determination system 1C according to a fourth embodiment. What is different from the signal amplification determination system 1 is that a signal amplification determination system 1C, a control signal generator circuit 25C further outputs a control signal φ3 to control operation of the window comparator 42.

Figure 9:
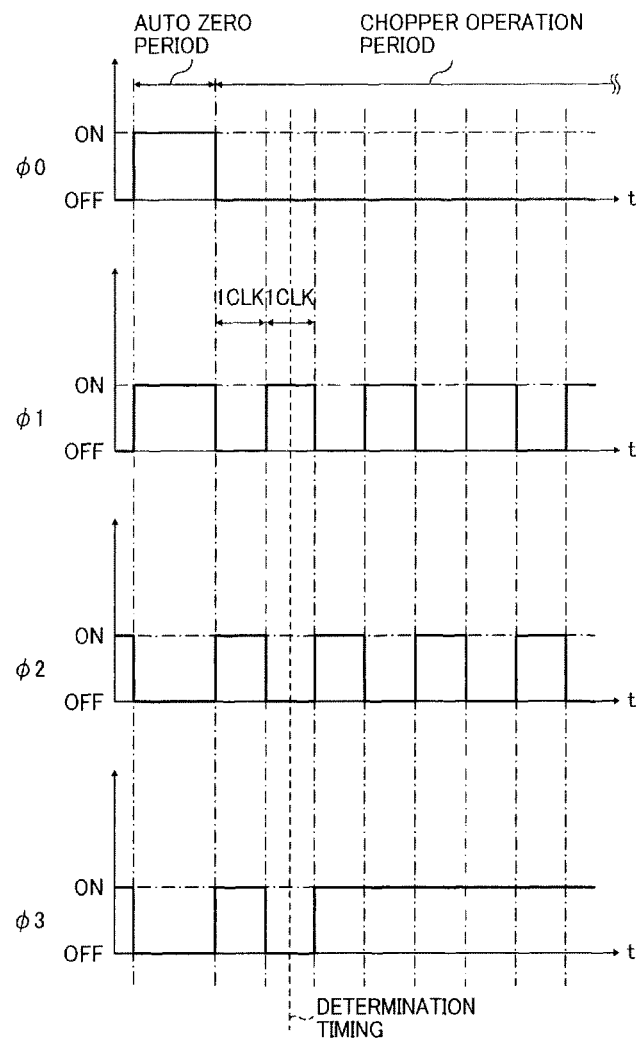
FIG. 9 is a tuning chart illustrating control signals φ0 to φ3 output from a control signal generator circuit shown in FIG. 8.

FIG. 9 is a timing chart illustrating the control signals φ0 to φ3 output from the control signal generator circuit 25C shown in FIG. 8. The control signal generator circuit 25C outputs the control signal φ3 to the window comparator 42 to activate and stop the window comparator 42. Specifically, in the automatically zero period during which the amplification of the signal is not performed, the control signal generator circuit 25C outputs a low-level signal to stop the operation of the window comparator 42 as the control signal φ3. The control signal generator circuit 25C outputs a high-level signal as the control signal φ3 before and after the signal determination is performed. With this configuration, without losing the function to determine the signal by the signal amplification determination circuit 41C, this system can restrain the consumption of the power supply in the auto zero period during which the detection of the signal is not needed.

In the signal amplification determination system 1C of the present fourth embodiment, adding the configuration of the fourth embodiment can achieve effects similar to those of the signal amplification circuit 41 described above, the power consumption can be restricted because the window comparator 42 performs the determination immediately after the chopper operation is started. The configuration of the present disclosure can be combined with the first embodiment, second embodiment, and the third embodiment.

Numerous additional modifications and variations are possible in light of the above teachings. It is therefore to be understood that, within the scope of the appended claims, the disclosure of this patent specification may be practiced otherwise than as specifically described herein.

What is claimed is:

1. A signal amplification circuit comprising:
an input terminal;
a first chopper modulation circuit to perform chopper modulation on an input signal from the input terminal at a predetermined chopper frequency depending on a predetermined control signal and generate a first chopper modulation signal;
a first amplifier, comprising:
an amplification circuit having an input terminal, a first output terminal, and a second output terminal, to amplify the first chopper modulation signal input from the first chopper modulation circuit via the input terminal to output an amplified signal via the second output terminal; and
a chopper demodulation circuit to perform chopper demodulation on the amplified signal output from the second output terminal of the amplification circuit at a chopping frequency to output a demodulated signal via an output terminal of the chopper demodulation circuit;
a capacitance feedback circuit to feed back the demodulated signal output from output terminals of the chopper demodulation circuit to the input terminal of the amplification circuit of the first amplifier via a feedback point connected between the first chopper modulation circuit and the amplification circuit,
the capacitance feedback circuit comprising:
a second chopper modulation circuit to perform chopper modulation on the demodulated signal from the chopper demodulation circuit at the predetermined chopper frequency depending on the predetermined control signal to generate a second chopper modulation signal for outputting to the input terminal of the amplification circuit of the first amplifier via the feedback point of the capacitance feedback circuit;
a first switch to perform automatically zero operation of inputting a signal voltage output from the first output terminal of the amplification circuit of the first amplifier in an auto zero period before an amplification period, the connection of the first switch and the amplification circuit constituting a voltage follower circuit;
a second switch to connect the input terminal of the signal amplification circuit and the feedback point via the first chopper modulation circuit;
a second amplifier to convert the amplified signal from the second output terminal of the amplification circuit into a single-end signal; and
a filter to pass at least a predetermined frequency component of the chopping frequency from the single-end signal from the second amplifier to output an output signal of the signal amplification circuit.

2. The signal amplification circuit according to claim 1, wherein the filter comprises:
a high-pass filter to remove a low-frequency component lower than a frequency component of the chopping frequency; and
a low-pass filter to remove a high-frequency component higher than the frequency component of the chopping frequency.

3. The signal amplification circuit according to claim 2, further comprising:
an impedance conversion element to convert a first impedance into a second impedance that is smaller than the first impedance, provided between the high-pass filter and the low-pass filter that is provided in a subsequent stage of the high-pass filter.

4. The signal amplification circuit according to claim 1, further comprising:
an impedance conversion circuit to convert a first impedance into a second impedance that is smaller than the first impedance, having a low-pass filter to remove a high-frequency component higher than the frequency component of the chopping frequency, provided in a subsequent stage of the filter,
wherein the filter comprises a high-pass filter to remove a low-frequency component lower than a frequency component of the chopping frequency.

5. The signal amplification circuit according to claim 1, wherein the chopper demodulation circuit is provided outside of the first amplifier.

6. A signal amplification determination circuit comprising:
a signal amplification circuit comprising:
an input terminal;
a first chopper modulation circuit to perform chopper modulation on an input signal from the input terminal at a predetermined chopper frequency depending on a predetermined control signal and generate a first chopper modulation signal;
a first amplifier, comprising:
an amplification circuit having an input terminal, a first output terminal, and a second output terminal, to amplify the first chopper modulation signal input from the first chopper modulation circuit via the input terminal to output an amplified signal via the second output terminal; and
a chopper demodulation circuit to perform chopper demodulation on the amplified signal output from the second output terminal of the amplification circuit at a chopping frequency to output a demodulated signal via an output terminal of the chopper demodulation circuit;
a capacitance feedback circuit to feed back the demodulated signal output from output terminals of the chopper demodulation circuit to the input terminal of the amplification circuit of the first amplifier via a feedback point connected between the first chopper modulation circuit and the amplification circuit,
the capacitance feedback circuit comprising:
a second chopper modulation circuit to perform chopper modulation on the demodulated signal from the chopper demodulation circuit at the predetermined chopper frequency depending on the predetermined control signal to generate a second chopper modulation signal for outputting to the input terminal of the amplification circuit of the first amplifier via the feedback point of the capacitance feedback circuit;
a first switch to perform automatically zero operation of inputting a signal voltage output from the first output terminal of the amplification circuit of the first amplifier in an auto zero period before an amplification period, the connection of the first switch and the amplification circuit constituting a voltage follower circuit;
a second switch to connect the input terminal of the signal amplification circuit and the feedback point via the first chopper modulation circuit;
a second amplifier to convert the amplified signal from the second output terminal of the amplification circuit into a single-end signal; and
a filter to pass at least a predetermined frequency component of the chopping frequency from the single-end signal from the second amplifier to output an output signal of the signal amplification circuit; and
a determination circuit to determine whether the level of the output signal from the signal amplification circuit is in a certain range to output a determination result.

7. The signal amplification determination circuit according to claim 6, further comprising:
a control circuit to stop operation of the determination circuit in the auto zero period and to operate the determination circuit in the chopper operation period.

* * * * *